United States Patent [19]

Leterrier

[11] Patent Number: 5,675,541
[45] Date of Patent: Oct. 7, 1997

[54] DEVICE COMPRISING MEANS FOR VALIDATING DATA WRITTEN IN A MEMORY

[75] Inventor: Benoit Leterrier, Palaiseau, France

[73] Assignee: U.S. Philips Corporation, New York, N.Y.

[21] Appl. No.: 445,989

[22] Filed: May 22, 1995

Related U.S. Application Data

[63] Continuation of Ser. No. 232,852, Apr. 25, 1994, abandoned, which is a continuation of Ser. No. 36,769, Mar. 25, 1993, abandoned.

[30] Foreign Application Priority Data

Mar. 25, 1992 [FR] France .................... 92 03619

[51] Int. Cl.$^6$ .................................................. G11C 7/00
[52] U.S. Cl. .................. 365/189.01; 365/155.29; 235/379; 235/382
[58] Field of Search .................... 235/379, 380, 235/382, 382.5, 494; 365/189.01, 189.07, 200, 201, 185.29, 185.33

[56] References Cited

U.S. PATENT DOCUMENTS

| | | | |
|---|---|---|---|
| 4,780,602 | 10/1988 | Kawana et al. | 235/380 |
| 4,870,260 | 9/1989 | Niepolomski et al. | 235/494 |
| 4,877,945 | 10/1989 | Fujisaki | 235/379 |
| 4,888,686 | 12/1989 | Sinz | 365/189.07 X |
| 5,243,175 | 9/1993 | Kato | 235/380 X |

FOREIGN PATENT DOCUMENTS 0398545  11/1990  European Pat. Off. ............ 235/379

*Primary Examiner*—David C. Nelms
*Assistant Examiner*—Son Mai
*Attorney, Agent, or Firm*—Brian J. Wieghaus

[57] ABSTRACT

The device comprises an EEPROM memory. A data written in this memory is considered to be valid if two "neutral" locations are situated contiguously with the data to be validated.

The "neutral" locations are produced by a prior erasure which is necessary for the EEPROM memory in order to write a data.

10 Claims, 2 Drawing Sheets ical support 1 which is referred to hereinafter as a microchip card or simply a card. The microcircuit 2 of the card has an architecture which is essentially known. The architecture consists of an 8-bit microprocessor 3 which may include a memory RAM 10, two memories RAM 4 and 5, connected as buffers, a program memory ROM 6, and a data memory 7 of the type EPROM or EEPROM. The memory RAM 4 is connected to the microprocessor 3 via a bidirectional address

DEVICE COMPRISING MEANS FOR VALIDATING DATA WRITTEN IN A MEMORY

This is a continuation of application Ser. No. 08/232,852, filed Apr. 25, 1994, which is a continuation of application Ser. No. 08/036,769, filed Mar. 25, 1993, now abandoned.

BACKGROUND OF THE INVENTION

The present invention relates to a device comprising means for validating data written in a memory.

A device of this kind is widely used, notably when it serves as a payment device (card comprising a microcircuit or chipcard).

A problem encountered in a device of this kind is the validation of the transaction or the validation of the data written. It is important that the data is recorded with a high degree of reliability. Therefore, the device is often made of an electrically erasable programmable read-only memory (EEPROM) for storing the value and the validity of the last transaction. The problem is complicated by the fact that the electrically erasable programmable read-only memory (EEPROM) can cope with only a limited number of write operations and, in order to allow for intensive use, it has been proposed to organize the memory as a circular memory so that each data written does not occupy the location of the preceding data. Thus, the number of locations of said circular memory increases as the number of possible transactions increases.

Patent EP 0 398 545 describes a device of this kind in which a bit or flag is used to indicate whether the input data is valid. In order to this flag it is necessary to carry out a supplementary write operation in order to position the flag. In the case of a EEPROM, the time required for writing in the memory is comparatively long (several milliseconds). Therefore, this write operation is considered to be a drawback.

SUMMARY OF THE INVENTION

The present invention proposes a device of the kind set forth in which it is not necessary to use a flag bit.

To this end, a device of this kind is characterized in that the validation mechanism assigns at least two contiguous "neutral" locations to the data to be validated.

BRIEF DESCRIPTION OF THE DRAWINGS

The invention will be described in detail hereinafter with reference to the accompanying drawings. Therein.

DETAILED DESCRIPTION OF THE PREFERRED EMBODIMENTS

Figure 1:
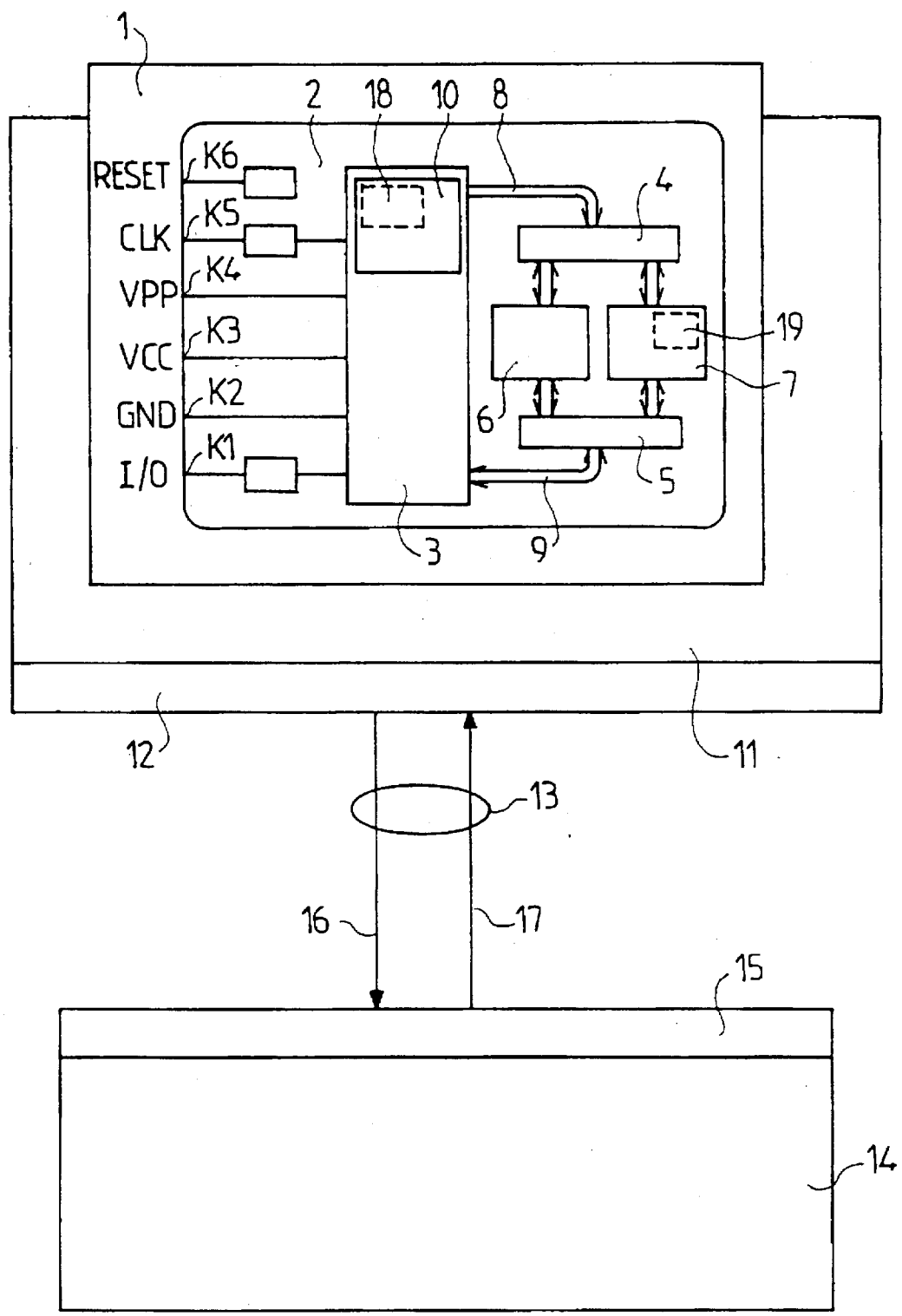
FIG. 1 shows a device in accordance with the invention.

FIG. 1 shows a movable and portable electronic support 1 which is referred to hereinafter as a microchip card or simply a card. The microcircuit 2 of the card has an architecture which is essentially known. The architecture consists of an 8-bit microprocessor 3 which may include a memory RAM 10, two memories RAM 4 and 5, connected as buffers, a program memory ROM 6, and a data memory 7 of the type EPROM or EEPROM. The memory RAM 4 is connected to the microprocessor 3 via a bidirectional address bus 8 and the memory RAM 5 is connected to the microprocessor via a bidirectional data bus 9. Moreover, each RAM 4, 5 is connected to the memories 6, 7 via a respective bidirectional bus (not shown).

The card 1 is shown symbolically as being inserted into a reader 11. The card comprises six contacts K1, K2, K3, K4, K5 and K6 which, in this inserted position, cooperate with six corresponding contacts of the reader and which, proceeding from the bottom upwards in FIG. 1, are shown in diagrammatic form in random order: the serial input/output contact I/O, the ground contact GND, the power supply for the microcircuit VCC (5 V), the programming power supply VPP, the clock CLK and the reset to zero RESET. These six contacts are connected to the microcircuit via ports (not shown). Via an interface 12 and a communication link, for example, a transmission line 13, the reader communicates with a remote host system 14 which itself also comprises an interface 15. The transmission line 13 is symbolically represented by two wires: the wire 16 which transmits the information from the reader 11 to the host system 14 and the wire 17 which transports the information in the opposite direction.

The problem is, therefore, that during a transaction a data validating the transaction is to be written into the memory EEPROM 7. This becomes particularly critical when said write operation is not fully completed, notably because of jamming of the card or interruption of the power supply. In order to validate this transaction, i.e. to certify the end of a write operation (or a rewrite operation), the invention proposes the use of the memory EEPROM as a circular memory whose locations are marked by the address codes A0, A1 ..., A4, A5, A6, the writing of the data succeeding that at the location A6 taking place at the location A0 ... etc; a data is certified if it is contiguous with at least two "neutral" locations. For a conventional EEPROM memory, this corresponds to an erasure, the word then being "FF" in a hexadecimal notation.

Figure 2:
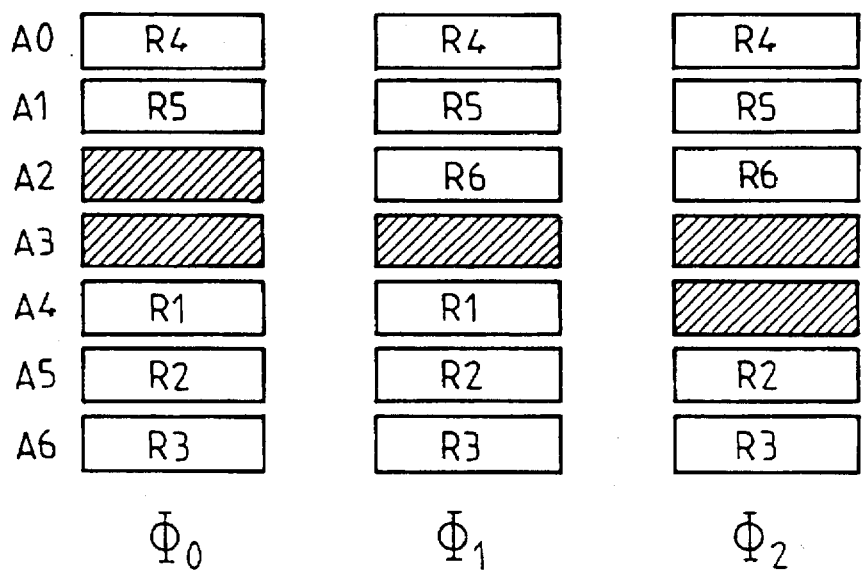
FIG. 2 illustrates the writing in the non-volatile memory.

FIG. 2 illustrates the principle of the invention.

$\Phi_0$ represents the initial state. The valid information is R5 situated at the location A1. The next two elements, at the addresses A2 and A3, contain the code "FF", signifying that these two boxes have already been erased.

$\Phi_1$ represents the writing of the data R6 at the location A2.

$\Phi_2$ represents the erasure of the oldest data R1. This effective erasure constitutes the validation of the data R6.

Thus, the interruption of the operation before the normal end of $\Phi_2$ leaves only a single virgin location in the memory EEPROM 7 and hence the data R6 will be considered to be invalid.

This operation is performed by a program contained in the memory ROM 6.

Figure 3:
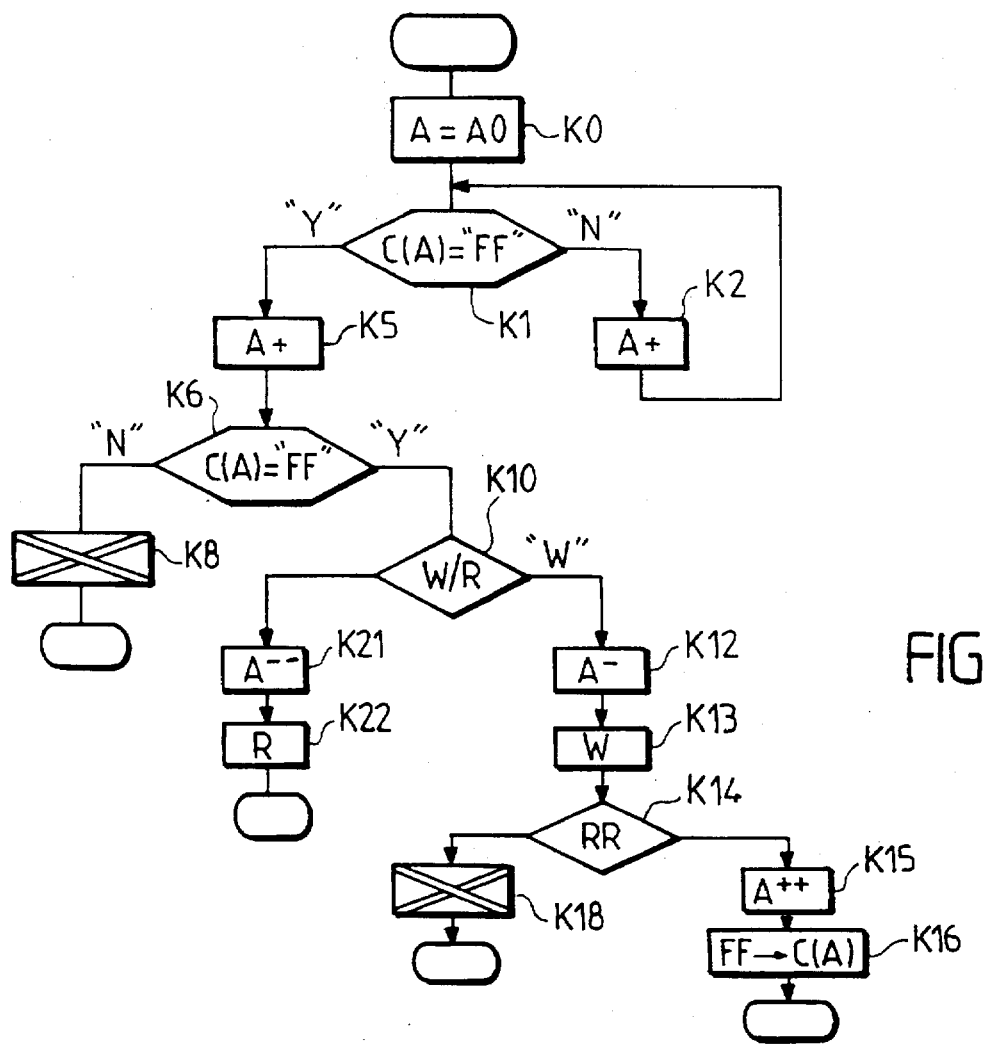
FIG. 3 shows a flow chart illustrating the use of the validation means.

The program shown in FIG. 3 starts with the box K0 in which an address counter A (modulo-7) is initialized by the value Ao which corresponds to the first location of the circular memory. Subsequently, in the box K1 it is tested whether this location is empty ("FF"). If it is not empty, the operation proceeds to the box K2 in which the counter A is incremented by one unit and a return is made to the box K1. If the circular memory location is empty, the counter A is incremented by one unit (box K5). It is then determined whether the next location of the circular memory is empty. If it is not empty, the information is not validated and a process induced by said invalidation is initiated (box K8). Because this process does not form part of the invention, it is not described. If the test of the box K6 is positive, a read or write operation can be undertaken as a function of a test indicated in the box K10.

A write operation starts by decrementing the counter A (box K12) by one unit, followed by the writing of the data (box K13). After verification (by rereading) that the data is correct (box K14), the counter A is incremented by two units (box K15), after which the location indicated by this counter is erased (box K16). When the data written is false, the program enters an error processing routine not described herein (box K18) and does not erase C(A).

For the execution of the read operation, the counter A should be decremented by two units (box K21) before the read operation takes place (box K22).

What is claimed is:

1. A data processing device comprising:

a memory including a plurality of memory locations for storing data;

determining means for determining whether a first and a second contiguous memory location have respective data values corresponding to an erasure;

writing means for writing data into said first of said plurality of memory locations in said memory upon said determining means having determined that said first and second memory location have data values corresponding to an erasure; and validation means for validating the writing of said data into said first memory location by placing a predetermined data value into another of said memory locations, corresponding to an erasure, said another of said memory locations being contiguous to said second memory location.

2. The device as claimed in claim 1, wherein said memory is a circular memory.

3. The device of claim 1, wherein said memory is an electrically erased programmable read-only memory (EEPROM) and that said predetermined data value in said another memory location represents a free memory location.

4. The device as claimed in claim 1, wherein said validation means verify the validity of said data by checking whether said another memory location includes said predetermined data value.

5. The device of claim 2, wherein said memory is an electrically erased programmable read-only memory (EEPROM) and that said predetermined data value in said another memory location represents a free memory location.

6. The device as claimed in claim 2, wherein said validation means verify the validity of said data by checking whether said another memory location includes said predetermined data value.

7. The device as claimed in claim 3, wherein said validation means verify the validity of said data by checking whether said another memory location includes said predetermined data value.

8. The data processing device of claim 1, wherein said validation means places a predetermined data value into a further memory location, said further memory location contiguous to one of said first memory location and said another of said memory locations.

9. A method of writing data into a memory validating the data written into the memory, said memory including a plurality of memory locations, comprising the steps determining whether a first memory location includes a first predetermined data value;

determining whether a second memory location includes a second predetermined data value;

writing data into said first memory location when said first predetermined value and said second predetermined value are determined to be equal; and placing a third predetermined value into a third memory location contiguous to said second memory location, said third predetermined value corresponding to an erasure.

10. A data processing device, comprising:

a memory including a plurality of memory locations for storing a plurality of data values;

writing means for writing successive data values into successive memory locations of said memory; and validation means for validating data values written into said memory locations;

said writing means writing a next successive data value into a next successive memory location in said memory only upon said validation means validating the next prior written data value;

said validation means validating the next prior writing data value by determining if first and second contiguous memory locations successive to the memory location of the next prior written data value correspond to an erasure; and said validation means validating the writing of said next successive data value by placing a predetermined data value corresponding to an erasure into a third memory location contiguous to said second memory location.

* * * * *